(12) United States Patent
Hashi

(10) Patent No.: US 8,860,285 B2
(45) Date of Patent: Oct. 14, 2014

(54) ELECTRONIC COMPONENT AND METHOD FOR PRODUCING ELECTRONIC COMPONENT

(75) Inventor: Yukihiro Hashi, Shiojiri (JP)

(73) Assignee: Seiko Epson Corporation (JP)

( * ) Notice: Subject to any disclaimer, the term of this patent is extended or adjusted under 35 U.S.C. 154(b) by 285 days.

(21) Appl. No.: 13/027,598

(22) Filed: Feb. 15, 2011

(65) Prior Publication Data

US 2011/0234330 A1 Sep. 29, 2011

(30) Foreign Application Priority Data

Mar. 25, 2010 (JP) ................. 2010-071041

(51) Int. Cl.
| H03B 5/32 | (2006.01) |
| H03H 9/10 | (2006.01) |
| H03H 3/04 | (2006.01) |
| H03H 9/05 | (2006.01) |
| H03H 9/215 | (2006.01) |
| H03H 3/02 | (2006.01) |

(52) U.S. Cl.
CPC ....... *H03H 9/1021* (2013.01); *H03H 2003/026* (2013.01); *H03H 3/04* (2013.01); *H03H 9/0519* (2013.01); *H03H 9/215* (2013.01)
USPC ............ 310/348; 310/344; 331/158; 361/752

(58) Field of Classification Search
CPC ..... H03H 9/1021; H03H 9/1014; H01L 1/053
USPC .................... 310/348, 344; 361/752; 331/158
See application file for complete search history.

(56) References Cited

U.S. PATENT DOCUMENTS

| 7,279,824 B2 * | 10/2007 | Tanaya et al. ................. 310/344 |
| 2009/0102323 A1 * | 4/2009 | Hashimoto ................... 310/351 |
| 2009/0256449 A1 * | 10/2009 | Nishimura et al. ........... 310/348 |
| 2010/0079962 A1 * | 4/2010 | Hashi ............................ 361/752 |
| 2010/0237749 A1 * | 9/2010 | Hashimoto ................... 310/348 |

FOREIGN PATENT DOCUMENTS

| JP | 11-261360 | 9/1999 |
| JP | 2010-081308 | 4/2010 |

* cited by examiner

*Primary Examiner* — Derek Rosenau
*Assistant Examiner* — Bryan Gordon
(74) *Attorney, Agent, or Firm* — Harness, Dickey & Pierce, P.L.C.

(57) ABSTRACT

An electronic component includes: a base material having a first conductive section; an oscillation piece having a second conductive section; a first member which is covered with a third conductive section making conductive contact with the first and second conductive sections and is provided between the base material and the oscillation piece; and a second member which is provided so as to be surrounded with the base material, the oscillation piece, and the first member and holds the base material and the oscillation piece.

6 Claims, 7 Drawing Sheets

ELECTRONIC COMPONENT AND METHOD FOR PRODUCING ELECTRONIC COMPONENT

BACKGROUND

1. Technical Field

The present invention relates to electronic components and methods for producing an electronic component.

2. Related Art

For example, an electronic component including an oscillation piece such as a quartz oscillator is fixed in a state in which an excitation electrode provided in the quartz oscillator and a connecting electrode for connection with a drive circuit driving the quartz oscillator make conductive contact with each other by conductive paste such as solder (see, for example, JP-A-11-261360 (Patent Document 1)). When such conductive paste is used, there is a possibility that a connecting section between the quartz oscillator and the connecting electrode is damaged when an impact such as a drop impact is given thereto. This becomes a contributing factor to a decrease in connection reliability.

Therefore, there may be a mounting structure of an electronic component, the structure in which a bump electrode formed of a core section having elasticity and a conductive film provided on the front surface of the core section is provided in the excitation electrode and the bump electrode and the connecting electrode are made to make conductive contact with each other via an adhesive. However, when such a bump electrode is adopted, there is a possibility that out gas generated from the adhesive changes the vibration characteristics of the quartz oscillator and reduces reliability.

SUMMARY

An advantage of some aspects of the invention is to provide an electronic component and a method for producing an electronic component, the electronic component and method which can prevent a decrease in electronic component characteristics by preventing the influence of out gas.

An electronic component according to an aspect of the invention includes: a base material having a first conductive section; an oscillation piece having a second conductive section; a first member which is covered with a third conductive section making conductive contact with the first and second conductive sections and is provided between the base material and the oscillation piece; and a second member which is provided so as to be surrounded with the base material, the oscillation piece, and the first member and holds the base material and the oscillation piece.

With the electronic component according to the aspect of the invention, since the second member holding the base material and the oscillation piece is encapsulated in a region surrounded with the base material, the oscillation piece, and the first member, it is possible to encapsulate the out gas generated from the second member in a region surrounded with the base material, the oscillation piece, and the first member. This makes it possible to prevent the characteristics of the electronic component from decreasing due to the out gas.

Moreover, in the electronic component according to the aspect of the invention, it is preferable that the first member be provided in one of the base material and the oscillation piece, and the second member be provided in the other of the base material and the oscillation piece. With this structure, it is possible to perform mounting in such a way that the first member and the second member face each other. This makes it possible to determine the position of the oscillation piece easily with respect to the base material.

Furthermore, in the electronic component according to the aspect of the invention, it is preferable that the first member be provided in the base material, and the second member be provided in the oscillation piece. With this structure, the first conductive section and the third conductive section can be formed integrally. This makes it possible to form the first conductive section and the third conductive section in the same process and thereby simplify the production process.

In addition, in the electronic component according to the aspect of the invention, it is preferable that the first member be provided in the oscillation piece, and the second member be provided in the base material. With this structure, the second conductive section and the third conductive section can be formed integrally. This makes it possible to form the second conductive section and the third conductive section in the same process and thereby simplify the production process.

Moreover, in the electronic component according to the aspect of the invention, it is preferable that the first member include a resin section covered with the third conductive section. With this structure, since the first member has elasticity, it is possible to reduce the burden on the conduction section even if an impact is given thereto from the outside.

According to another aspect of the invention, there is provided a method for producing an electronic component formed by establishing conductive connection between a base material having a first conductive section and an oscillation piece having a second conductive section, the method including: forming a first member in the shape of a ring on the base material; forming a second member on the oscillation piece; covering the first member with a third conductive section making conductive contact with the first conductive section; and holding the base material and the oscillation piece by the second member in a state in which the second member is placed in a region inside the ring and the second and third conductive sections make conductive contact with each other.

Moreover, according to still another aspect of the invention, there is provided a method for producing an electronic component formed by establishing conductive connection between a base material having a first conductive section and an oscillation piece having a second conductive section, the method including: forming a first member in the shape of a ring on the oscillation piece; forming a second member on the base material; covering the first member with a third conductive section making conductive conduct with the second conductive section; and holding the base material and the oscillation piece by the second member in a state in which the second member is placed in a region inside the ring and the first and third conductive sections make conductive conduct with each other.

With the method for producing an electronic component according to the aspect of the invention, it is possible to encapsulate the second member holding the base material and the oscillation piece in a region surrounded with the base material, the oscillation piece, and the first member. This makes it possible to encapsulate the out gas generated from the second member in a region surrounded with the base material, the oscillation piece, and the first member and prevent the characteristics of the electronic component from decreasing due to the out gas.

BRIEF DESCRIPTION OF THE DRAWINGS

The invention will be described with reference to the accompanying drawings, wherein like numbers reference like elements.

DESCRIPTION OF EXEMPLARY EMBODIMENTS

Figure 1:
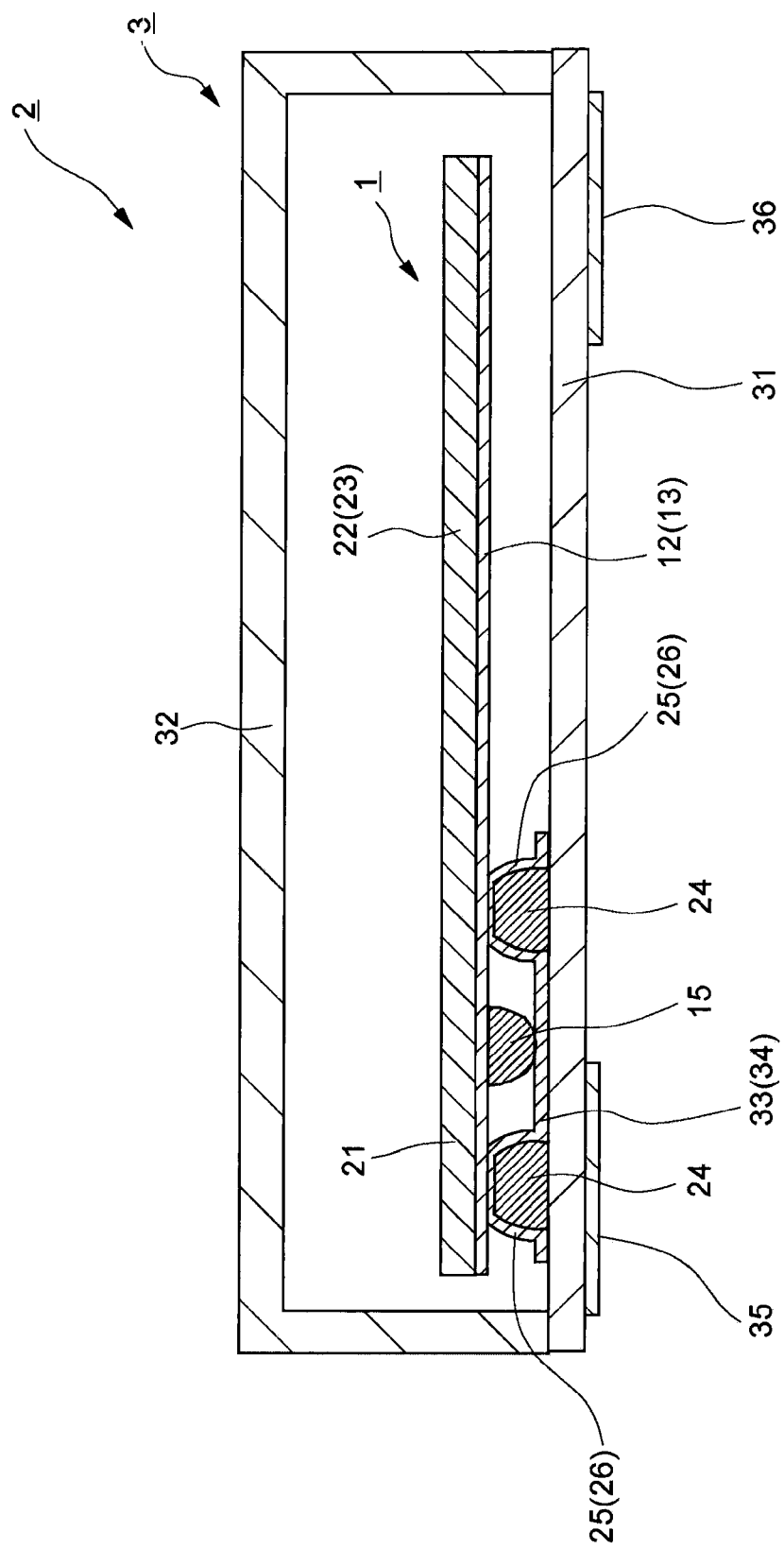
FIG. 1 is a diagram showing the sectional structure of a quartz oscillator package according to the invention.

Hereinafter, an embodiment of the invention will be described with reference to the drawings. Incidentally, in the drawings used in the following descriptions, component members are appropriately scaled to make the component members visible.

Figure 2A:
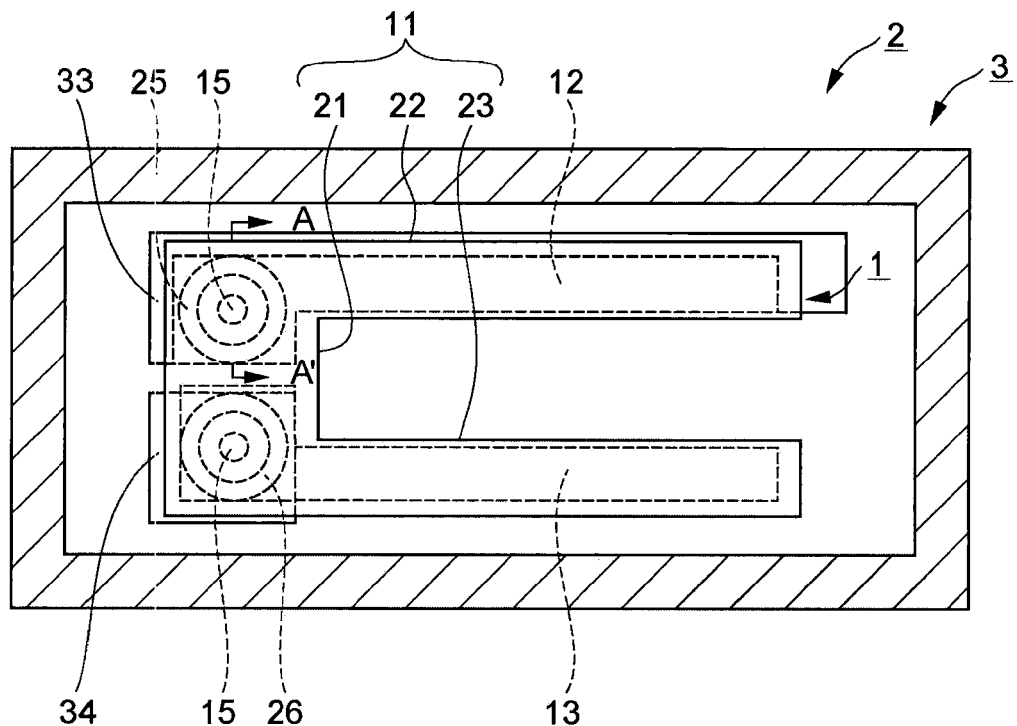
FIG. 2A is a plan view of the quartz oscillator package.
Figure 2B:
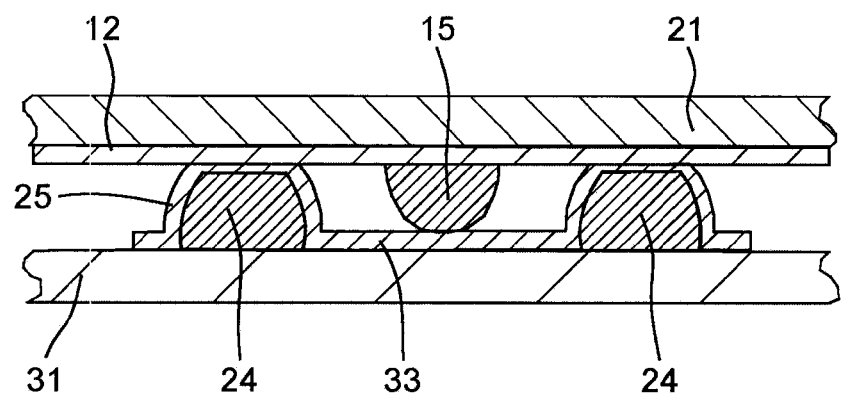
FIG. 2B is a diagram showing the mounting structure of a quartz oscillator.
Figure 3A:
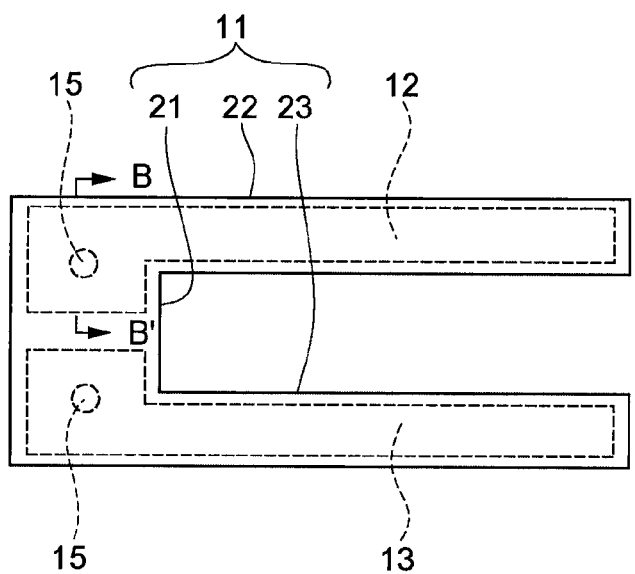
FIGS. 3A and 3B are diagrams showing the structure of a crystal piece in the quartz oscillator package.
Figure 3B:
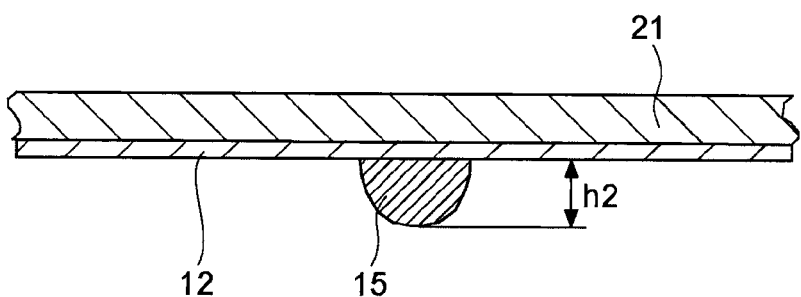
Figure 4A:
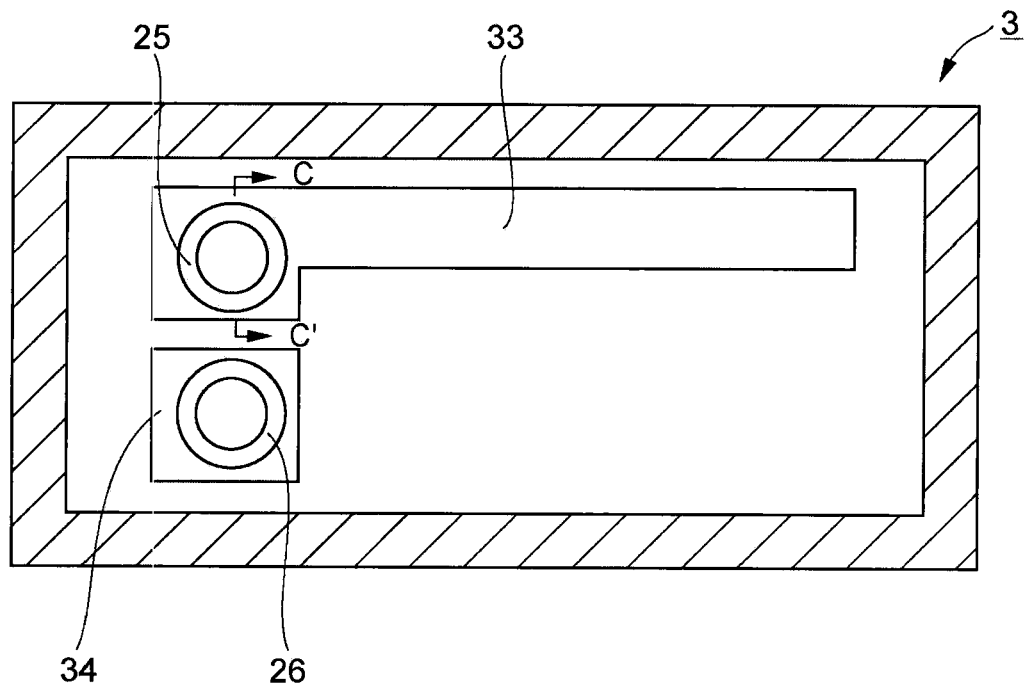
FIGS. 4A and 4B are diagrams showing the structure of a case in the quartz oscillator package.
Figure 4B:
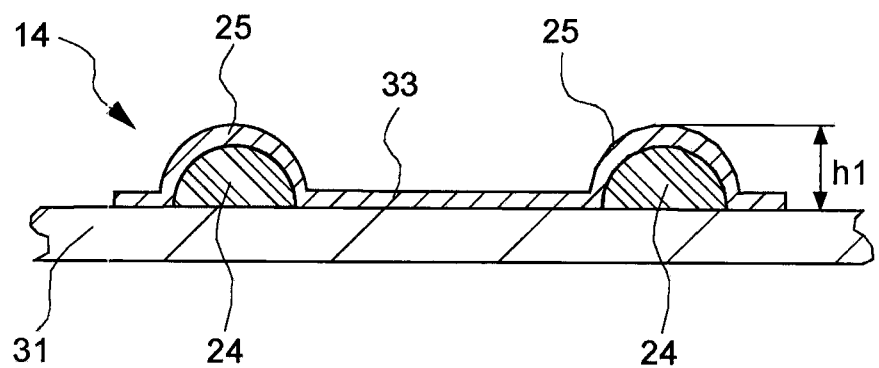

FIG. 1 is a diagram showing a quartz oscillator package which is an example of an electronic component according to the invention. FIG. 1 is a diagram showing the sectional structure of the quartz oscillator package. FIG. 2A is a plan view of the quartz oscillator package, and FIG. 2B is a sectional view corresponding to a sectional view taken on the line A-A' indicated by an arrow in FIG. 2A, the sectional view showing the mounting structure of a quartz oscillator. Moreover, FIG. 3A is a plan view of a crystal piece in the quartz oscillator package, and FIG. 3B is a sectional view corresponding to a sectional view taken on the line B-B' indicated by an arrow in FIG. 3A. FIG. 4A is a plan view of a case in the quartz oscillator, and FIG. 4B is a sectional view corresponding to a sectional view taken on the line C-C' indicated by an arrow in FIG. 4A.

As shown in FIG. 1 and FIGS. 2A and 2B, the quartz oscillator package (the electronic component) 2 includes a quartz oscillator 1 and a case (a base material) 3 in which the quartz oscillator 1 is encapsulated. As shown in FIG. 1 and FIGS. 2A and 2B, the quartz oscillator 1 includes a crystal piece (an oscillation piece) 11, a pair of excitation electrodes (a second conductive section) 12 and 13 exciting the crystal piece 11, a bump electrode (a first member) 14, and bonding sections (a second member) 15.

The case 3 has formed therein connecting electrodes (a first conductive section) 33 and 34 used for electrical connection with the crystal piece 11 and terminal electrodes 35 and 36 used when the quartz oscillator package 2 is mounted on a circuit board (not shown) or the like.

As shown in FIGS. 3A and 3B, the crystal piece 11 is a plate-like member having a virtually U shape in a plan view and having a tuning-fork planar shape in which two arm sections 22 and 23 extend from the base section 21 and are arranged in parallel to each other in the same direction. The pair of excitation electrodes 12 and 13 is formed of conductive material such as Al (aluminum) or Au (gold), and is formed on one surface of the crystal piece 11. In addition, the excitation electrode 12 is formed from the base section 21 over the arm section 22 on one surface of the crystal piece 11. Moreover, the excitation electrode 13 is formed from the base section 21 over the arm section 23 on one surface of the crystal piece 11.

The case 3 includes a case main body 31 and a lid 32 covering the case main body 31. The case main body 31 is formed in the shape of a plate, and is formed of insulating material, such as ceramic, or Si (silicon) (in this embodiment, ceramic is used). In addition, on the upper surface of the case main body 31, the connecting electrodes 33 and 34 are formed. Moreover, on the lower surface of the case main body 31, the terminal electrodes 35 and 36 used when the quartz oscillator package 2 is mounted on a circuit board (not shown) or the like are formed.

The connecting electrodes 33 and 34 are each formed by laying an Au film on a Ni (nickel)-plated layer formed on a W (tungsten) film, for example, and are connected to the terminal electrodes 35 and 36 via the wiring (not shown) formed on the case main body 31.

The lid 32 is formed in the shape of a box, and, as is the case with the case main body 31, is formed of insulating material, such as ceramic, or Si (silicon) (in this embodiment, ceramic is used). In addition, the lid 32 is brazed, for example, to the outer circumferential portion of the case main body 31 and encapsulates the quartz oscillator 1 in a space (region) formed between the lid 32 and the case main body 31.

As shown in FIGS. 4A and 4B, the bump electrode 14 is formed on the upper surface of the case main body 31, and is provided in a state in which the bump electrode 14 is electrically connected to the connecting electrodes 33 and 34. As shown in FIG. 1, the bump electrode 14 includes a resin section 24 in the form of a projection and a pair of conductive films (a third conductive section) 25 and 26 formed on the front surface of the resin section 24. The conductive films 25 and 26 are only required to be formed in such a way that the resin section 24 is not exposed with respect to the arm sections 22 and 23, and there is no need to form the conductive films 25 and 26 on the entire front surface of the resin section 24.

The conductive films 25 and 26 are formed by performing patterning after film formation by sputtering, for example. In this embodiment, the conductive films 25 and 26 are formed as a continuous part of the connecting electrodes 33 and 34 by patterning an Au/Cr layer formed by sputtering, and there is continuity between the conductive films 25 and 26 and the connecting electrodes 33 and 34. That is, the quartz oscillator package 2 uses the bump electrode 14 as an electrical contact between the crystal piece 11 and the case 3.

Incidentally, the conductive films 25 and 26 may be formed of metal or an alloy such as Au (gold), TiW (titanium/tungsten), Cu (copper), Cr (chromium), Ni (nickel), Ti, W, NiV (nickel/vanadium), Al, Pd (palladium), and Pb-free solder or a single layer or a multilayer thereof. Moreover, the conductive films 25 and 26 may be formed of the same material. By forming the conductive films 25 and 26 by using the same material, it is possible to form the conductive films 25 and 26 in the same process. This makes it possible to simplify the production process.

As shown in FIGS. 4A and 4B, the bump electrode 14 is formed in the shape of a ring. In this embodiment, the bump electrode 14 is formed in the shape of a circular ring in a plan view, and the resin section 24 is also in the shape of a circular ring in a plan view. Moreover, as will be described later, the resin section 24 has a virtually semicircular cross-sectional shape by performing patterning on a resin material by photolithography or etching and then melting the resin pattern.

Since the resin section 24 is covered with the conductive films 25 and 26 as described above, it is possible to use various resin materials. For example, the resin section 24 is formed of photosensitive insulating resin or thermosetting insulating resin such as polyimide resin, acrylic resin, phenol resin, silicone resin, silicone-modified polyimide resin, and epoxy resin (in this embodiment, epoxy resin is used).

Furthermore, in a region corresponding to an inside of the circular ring formed of the bump electrode 14 (the resin section 24) in the crystal piece 11, a bonding section (a second member) 15 in the form of a projection is provided so as to be circular in a plan view. In this embodiment, the bonding section 15 is provided in such a way as to be surrounded with the case main body 31, the base section 21, and the bump electrode 14, and is encapsulated by the case main body 31, the base section 21, and the bump electrode 14. This makes it possible to mount the crystal piece 11 and the case main body 31 in such a way that the bonding section 15 fits into the bump electrode 14.

The bonding section 15 can mount (hold) the crystal piece 11 on the case main body 31 in a state in which the resin section 24 forming the bump electrode 14 is elastically deformed according to the front surface shapes of the excitation electrodes 12 and 13 and the conductive films 25 and 26 are made to make conductive contact with the excitation electrodes 12 and 13. As shown in FIG. 1, the quartz oscillator 1 has a one-side supported structure in which the base section 21 is supported by the case 3.

As the bonding section 15, it is possible to use various materials as long as the materials have adhesion properties on at least the front surface thereof. Specifically, in this embodiment, the bonding section 15 is formed of the same material (epoxy resin) as the resin section 24.

Moreover, the height h2 of the bonding section 15 is set at a height lower than the height h1 of the bump electrode 14. The "height" here refers to the length in a direction perpendicular to the upper surface of the case main body 31. However, when an uneven face, an inclined face, or the like, is formed on the upper surface of the case main body 31, the flat face other than the uneven face or the inclined face is treated as the upper surface of the case main body 31.

By setting the height h2 of the bonding section 15 at a height lower than the height h1 of the bump electrode 14, it is possible to hold the base material and the oscillation piece in a state in which the conductive films 25 and 26 are brought into intimate contact with the connecting electrodes 33 and 34 and the excitation electrodes 12 and 13 when the crystal piece 11 is mounted on the case 3. This makes it possible to encapsulate the bonding section 15 with reliability.

As described above, the quartz oscillator package 2 according to this embodiment can maintain good continuity by the bonding section 15 by using the bump electrode 14 as an electrical contact and mount the the crystal piece 11 on the case 3. Since the resin section 24 is covered with the conductive films 25 and 26, it is possible to prevent the out gas generated from the resin section 24 from decreasing the vibration characteristics of the quartz oscillator 1 (the crystal piece 11).

Moreover, as shown in FIG. 1, since the bonding section 15 is provided so as to be surrounded with the base section 21, the case main body 31, and the bump electrode 14, it is possible to encapsulate the out gas in a region surrounded with the base section 21, the case main body 31, and the bump electrode 14 even if the out gas is generated from the bonding section 15.

Furthermore, as shown in FIG. 1, as a result of the resin section 24 being elastically deformed according to the front surface shapes of the excitation electrodes 12 and 13, the conductive films 25 and 26 are brought into intimate contact with the excitation electrodes 12 and 13. That is, the bonding section 15 is brought into a confined state as a result of the bonding section 15 being surrounded with the case main body 31, the base section 21, and the bump electrode 14. This makes it possible to prevent the out gas generated from the bonding section 15 from decreasing the vibration characteristics of the quartz oscillator 1 (the crystal piece 11).

As described above, with the quartz oscillator package 2 according to this embodiment, it is possible to prevent the characteristics of the quartz oscillator 1 from decreasing due to the out gas generated from the bonding section 15, and thereby provide a quartz oscillator package with high reliability. Moreover, since both the resin section 24 and the bonding section 15 have elasticity, it is possible to reduce the burden on the conduction section in the bump electrode 14 and the connecting electrodes 33 and 34 even if an impact is given thereto from the outside. This makes it possible to obtain good conduction reliability. Furthermore, since the bump electrode can be formed by photolithography, it is possible to make the electrode more compact than the electrode formed by using the existing conductive paste.

Next, as an embodiment of a method for producing the electronic component according to the invention, a process for producing the quartz oscillator package 2 described above will be described. This embodiment has a feature in the process for forming the bump electrode 14 and the bonding section 15 described above. Therefore, descriptions will be given with importance placed on a method for producing the bump electrode 14 and the bonding section 15.

Figure 5A:
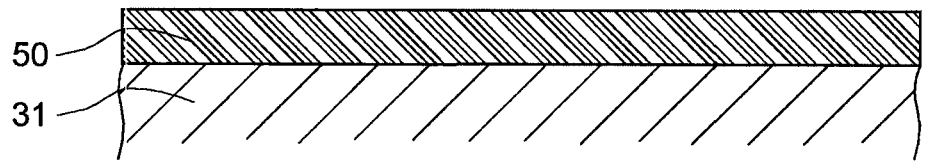
FIGS. 5A to 5D are diagrams showing a process for forming a resin section.
Figure 5B:
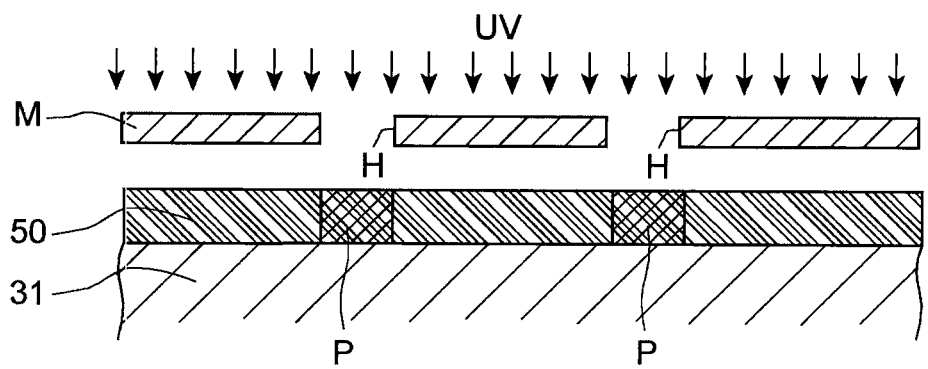
Figure 5C:
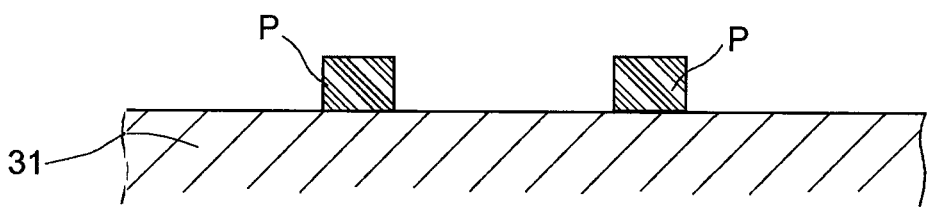

First, as shown in FIG. 5A, a photosensitive resin material 50 is applied to the upper surface of the case main body 31 by spin coating. Specifically, in this embodiment, epoxy resin having the function as an adhesive in a bonding process which will be described later is applied. Then, exposure and development processes are performed. Specifically, as shown in FIG. 5B, a photomask M having formed therein an opening H corresponding to a resin pattern P forming the resin section 24 is used. In this embodiment, the ring-shaped opening H is formed by bonding the photomask M to a supporting substrate (not shown) which allows ultraviolet radiation to pass therethrough. By performing exposure processing and development processing by using such a photomask M, as shown in FIG. 5C, the resin pattern P is formed on the case main body 31.

As described above, in this embodiment, since the resin pattern P is formed by photolithography, it is possible to form a fine pattern.

Figure 5D:
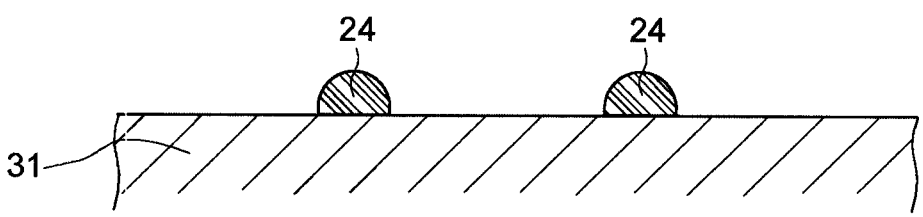

Then, as shown in FIG. 5D, heat is applied to the resin pattern P to melt the resin pattern P, whereby the semicircular resin section 24 is formed. In this embodiment, as a heating method, heating processing is performed by placing the case main body 31 in a heating furnace, for example.

After the resin section 24 is formed in the manner described above, the connecting electrodes 33 and 34 are formed on the case main body 31. The connecting electrodes 33 and 34 are patterned into an intended shape after an Au/Cr layer is formed by sputtering, for example. Specifically, the Au/Cr layer is patterned so as to cover the resin section 24. As a result, it is possible to form the connecting electrodes 33 and 34 and the conductive films 25 and 26 covering the resin section 24. As described above, in this embodiment, by forming the conductive films 25 and 26 by using part of the connecting electrodes 33 and 34, it is possible to simplify the production process. With the above processes, it is possible to produce the case 3 having the bump electrode 14 in a connection section of the connecting electrodes 33 and 34.

Figure 6A:
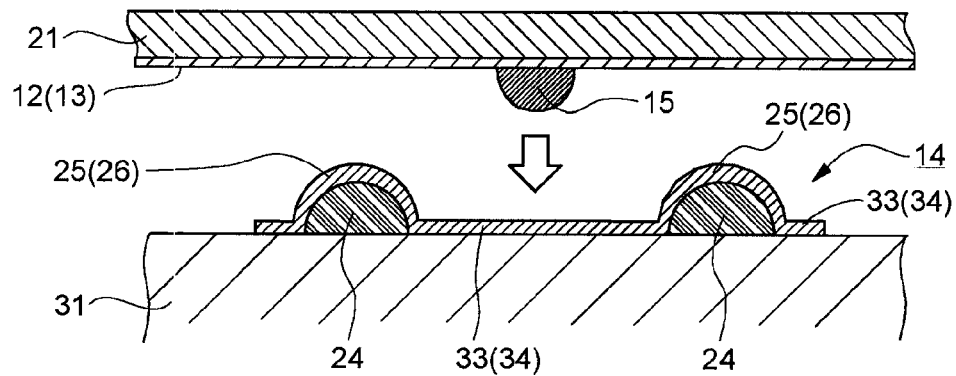
FIGS. 6A and 6B are diagrams explaining a method for mounting the quartz oscillator.
Figure 6B:
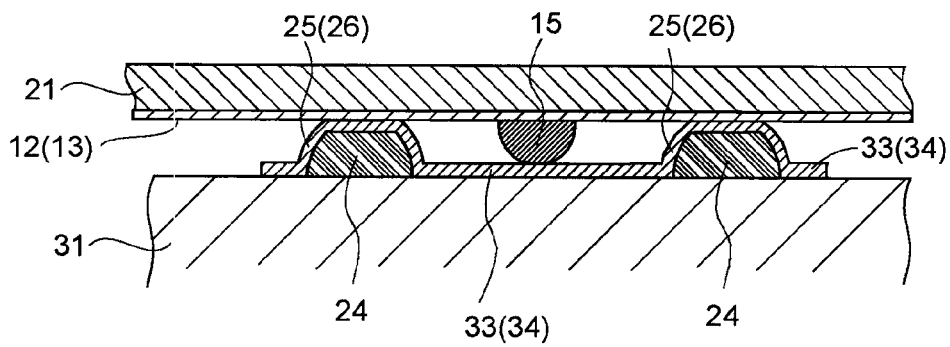

Next, a method for mounting the quartz oscillator 1 will be described with reference to FIGS. 6A and 6B. Here, FIGS. 6A and 6B are each a sectional view showing the bump electrode 14 when the crystal piece 11 is mounted on the case 3. First, the bonding section 15 and the connecting electrodes 33 and 34 are brought into contact with each other by making the excitation electrodes 12 and 13 provided in the crystal piece 11 make contact with and press against the bump electrode 14 formed in the case main body 31 (see FIGS. 6A and 6B). Incidentally, mounting of the quartz oscillator 1 is performed while at the same time heating is performed.

At this time, the resin section 24 is elastically deformed and follows the shapes of the excitation electrodes 12 and 13. Then, with the elastic deformation of the resin section 24, the conductive film 25 follows the front surface shape of the excitation electrode 12 and the conductive film 26 follows the front surface shape of the excitation electrode 13. As a result, the conductive film 25 and the conductive film 26 make conductive contact with the excitation electrode and the excitation electrode 13, respectively, in a sufficiently large contact area. Moreover, the bonding section 15 makes contact with the connecting electrodes 33 and 34. Then, the bonding section 15 is cured. As a result, the bonding section 15 can bond the bump electrode 14 and the excitation electrodes 12 and 13 together by elastic deformation of the resin section 24, and maintain a state in which the conductive film 25 and the excitation electrode 12 make contact with each other and a state in which the conductive film 26 and the excitation electrode 13 make contact with each other.

The crystal piece 11 is mounted on the case main body 31 in the manner described above. Then, the case main body 31 and the lid 32 are bonded together, whereby the quartz oscillator 1 is encapsulated. In this way, the quartz oscillator package 2 is formed. At this time, since the resin section 24 is covered with the conductive films 25 and 26, the out gas generated from the resin section 24 is prevented from decreasing the vibration characteristics of the quartz oscillator 1 (the crystal piece 11). Furthermore, as shown in FIG. 5B, the bonding section 15 is in a confined state as a result of the bonding section 15 being surrounded with the case main body 31, the base section 21, and the bump electrode 14. This prevents the out gas generated from the bonding section 15 from decreasing the vibration characteristics of the quartz oscillator 1 (the crystal piece 11).

The quartz oscillator package 2 formed in the manner described above has high reliability by preventing the characteristics of the quartz oscillator 1 from decreasing due to the out gas generated from the bonding section 15. Moreover, when an impact such as a drop impact is given to a connecting portion between the crystal piece 11 and the case main body 31, the resin section 24 is elastically deformed and absorbs the impact.

It should be understood that the invention is not limited to the embodiment described above, and that many modifications and variations are possible within the scope of the subject matter of the invention. For example, in the embodiment described above, an example in which the invention is applied to a turning fork quartz oscillator package has been described; however, the invention can also be applied to an electronic component such as an AT quartz oscillator package or a vibration gyrosensor.

Moreover, in the embodiment described above, one bonding section 15 is provided in the bump electrode 14 having a virtually circular ring shape in a plan view. However, it is also possible to increase the strength of bonding to the case main body 31 in the quartz oscillator 1 by disposing a plurality of bonding sections 15.

Moreover, in the embodiment described above, the bump electrode 14 has a circular ring shape in a plan view; however, the bump electrode 14 may have a ring shape including a straight line or a curved line in a plan view, or may have a ring shape including a straight line or a curved line. Furthermore, the bonding section 15 is only required to be able to hold the base material 3 and the crystal piece 11 in a state in which the bump electrode 14 is brought into intimate contact with the crystal piece 11. In the embodiment described above, the bonding section 15 has a circular shape in a plan view; however, the bonding section 15 may have a rectangular shape in a plan view. Moreover, the bonding section 15 may be formed into a semicylindrical shape. Here, the semicylindrical shape refers to a columnar shape in which a portion (the bottom) making contact with the case main body 31 is a flat surface, and the surface which does not make contact with the case main body 31 is a curved surface. Specifically, the bonding section 15 having a virtually semicylindrical shape includes the bonding section 15 having a virtually semicircular, semielliptical, or trapezoidal cross-sectional shape.

Figure 7:
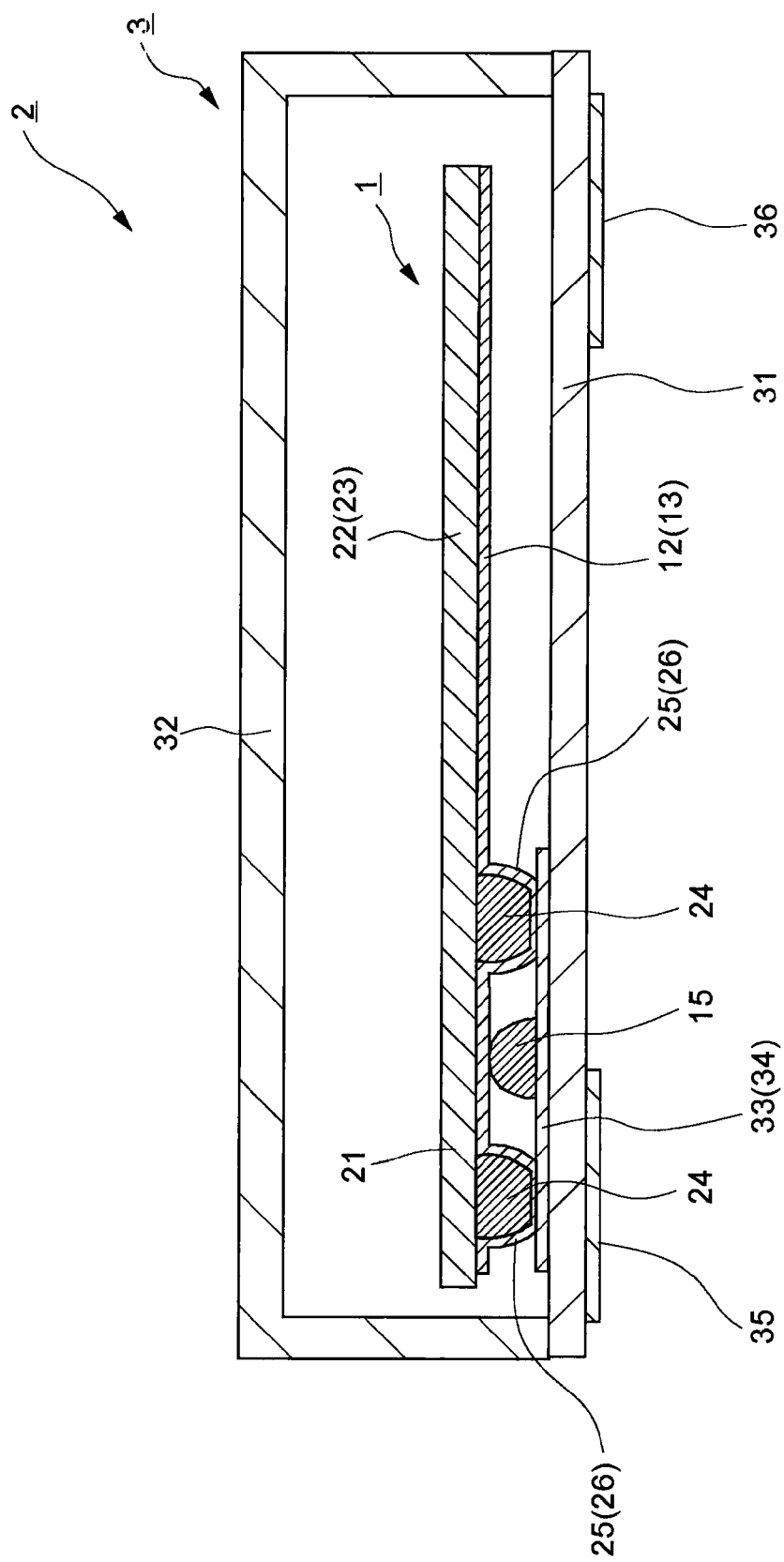
FIG. 7 is a sectional view showing a modified example of the quartz oscillator package according to the invention.

Moreover, in the embodiment described above, the bump electrode 14 is provided in the case 3. However, as shown in FIG. 7, the bump electrode 14 may be provided in the crystal piece 11. In this case, the conductive films 25 and 26 and the excitation electrodes 12 and 13 may be formed of the same material, and the conductive films 25 and 26 may be formed as a continuous part of the excitation electrodes 12 and 13. By forming the conductive films 25 and 26 and the excitation electrodes 12 and 13 by using the same material, it is possible to form the conductive films 25 and 26 and the excitation electrodes 12 and 13 in the same process and thereby simplify the production process.

The entire disclosure of Japanese Patent Application No. 2010-071041, filed Mar. 25, 2010 is expressly incorporated by reference herein.

What is claimed is:

1. An electronic component, comprising:
   a base material having a first conductive section;
   an oscillation piece having a second conductive section;
   a first member which is covered with a third conductive section making conductive contact with the first and second conductive sections and is provided between the base material and the oscillation piece; and
   a second member which is provided between the base material and the oscillation piece, wherein
   the second member is completely surrounded by the first member in a plan view.

2. The electronic component according to claim 1, wherein
   the first member is provided in one of the base material and the oscillation piece, and
   the second member is provided in the other of the base material and the oscillation piece.

3. The electronic component according to claim 2, wherein
   the first member is provided in the base material, and
   the second member is provided in the oscillation piece.

4. The electronic component according to claim 2, wherein
   the first member is provided in the oscillation piece, and
   the second member is provided in the base material.

5. The electronic component according to claim 1, wherein
   the first member includes a resin section covered with the third conductive section.

6. The electronic component according to claim 1, wherein
   the second member is sandwiched between the first and second conductive sections from a top and a bottom of the second member, and
   the second member is surrounded by the third conductive section from sides of the second member in the plan view.

* * * * *